US007359244B2

United States Patent
Kobayashi et al.

(10) Patent No.: US 7,359,244 B2
(45) Date of Patent: *Apr. 15, 2008

(54) NON-VOLATILE SEMICONDUCTOR MEMORY DEVICE AND SEMICONDUCTOR DISK DEVICE

(75) Inventors: Naoki Kobayashi, Setagaya (JP); Shunichi Saeki, Oume (JP); Hideaki Kurata, Kokubunji (JP)

(73) Assignees: Renesas Technology Corp., Tokyo (JP); Hitachi Device Engineering Co., Ltd., Mobara-Shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/492,929

(22) Filed: Jul. 26, 2006

(65) Prior Publication Data

US 2006/0262609 A1 Nov. 23, 2006

Related U.S. Application Data

(60) Continuation of application No. 10/975,818, filed on Oct. 29, 2004, now Pat. No. 7,116,586, which is a continuation of application No. 10/786,007, filed on Feb. 26, 2004, now Pat. No. 6,813,185, which is a continuation of application No. 10/205,426, filed on Jul. 26, 2002, now Pat. No. 6,714,452, which is a division of application No. 09/758,221, filed on Jan. 12, 2001, now Pat. No. 6,445,615.

(30) Foreign Application Priority Data

Jan. 12, 2000 (JP) .............................. 2000-006262

(51) Int. Cl.
*G11C 16/04* (2006.01)

(52) U.S. Cl. ............................. 365/185.11; 365/189.05

(58) Field of Classification Search ........... 365/185.11, 365/189.05
See application file for complete search history.

(56) References Cited

U.S. PATENT DOCUMENTS 5,422,856 A 6/1995 Sasaki et al.

(Continued)

FOREIGN PATENT DOCUMENTS

| JP | 1994-259974 | 9/1994 |
|---|---|---|
| JP | 10-63442 | 3/1998 |

OTHER PUBLICATIONS

Kawahara et al., "20-Mb/s Erase/Record Flash Memory by Asymmetrical Operation" Symposium on VLSI Circuits Digest of Technical Papers, 1996, pp. 174-175.
Kawahara et al, "20-Mb/s Erase/Record Flash Memory by Asymmetrical Operation"; IEEE Journal of Solid-State Circuits, vol. 33, No. 1, Jan. 1998, pp. 119-125.

*Primary Examiner*—Huan Hoang
(74) *Attorney, Agent, or Firm*—Antonelli, Terry, Stout & Kraus, LLP.

(57) ABSTRACT

A non-volatile memory device is provided which includes a flash memory having a plurality of banks and a bank selection register which can take on states at least equal in number to the number of banks. The bank selection register outputs a signal to point to one of the banks based upon one of the states of the bank selection register. A controller is also provided having a plurality of data buffers corresponding, respectively, to the banks. In addition to word lines, bit lines and memory cells, each bank includes a data register to temporarily hold data to be written to the memory cells. The controller transmits data in the data buffer to the data register of the pointed to bank, while the flash memory writes data held in the data register to the memory cells of another one of the banks.

3 Claims, 16 Drawing Sheets

U.S. PATENT DOCUMENTS

| | | |
|---|---|---|
| 5,603,001 A | 2/1997 | Sukegawa et al. |
| 5,654,912 A | 8/1997 | Hasegawa et al. |
| 5,903,509 A * | 5/1999 | Ryan et al. ............... 365/230.3 |
| 5,978,262 A | 11/1999 | Marouot et al. |
| 5,982,664 A | 11/1999 | Watanabe |
| 5,999,451 A | 12/1999 | Lin et al. |
| 6,034,891 A | 3/2000 | Norman |
| 6,078,520 A | 6/2000 | Tobita et al. |
| 6,256,681 B1 | 7/2001 | Chang |
| 6,434,034 B1 | 8/2002 | Wallace et al. |
| 6,594,183 B1 * | 7/2003 | Lofgren et al. ........ 365/185.33 |

* cited by examiner

FIG. 4

| WRITE-IN PRIORITY | CHIP NO. |
|---|---|
| HIGH | 1 |
| MEDIUM | 2 |
| LOW | 3 |

| CHIP NO. | STATUS |
|---|---|
| 1 | BUSY |
| 2 | BUSY |
| 3 | BUSY |
| 4 | BUSY |
| 5 | BUSY |
| 6 | BUSY |
| 7 | BUSY |
| 8 | READY |
| 9 | BUSY |
| 10 | BUSY |
| 11 | BUSY |
| 12 | BUSY |
| 13 | READY |
| 14 | BUSY |
| 15 | BUSY |
| 16 | BUSY |

FIG. 7

| PRIORITY | BUFFER INFORMATION | CHIP INFORMATION | WRITE-IN FLAG INFORMATION |
|---|---|---|---|
| 1 | BUFFER NO. (ADDRESS) | CHIP NO., ADDRESS | 1/0 |
| 2 | BUFFER NO. (ADDRESS) | CHIP NO., ADDRESS | 1/0 |
| 3 | BUFFER NO. (ADDRESS) | CHIP NO., ADDRESS | 1/0 |
| 4 | BUFFER NO. (ADDRESS) | CHIP NO., ADDRESS | 1/0 |
| 5 | BUFFER NO. (ADDRESS) | CHIP NO., ADDRESS | 1/0 |
| 6 | BUFFER NO. (ADDRESS) | CHIP NO., ADDRESS | 1/0 |
| 7 | BUFFER NO. (ADDRESS) | CHIP NO., ADDRESS | 1/0 |
| 8 | BUFFER NO. (ADDRESS) | CHIP NO., ADDRESS | 1/0 |

FIG. 9

| CHIP NO. | BUFFER INFORMATION 1 | BUFFER INFORMATION 2 |
|---|---|---|
| 1 | BUFFER NO. (ADDRESS) | BUFFER NO. (ADDRESS) |
| 2 | BUFFER NO. (ADDRESS) | BUFFER NO. (ADDRESS) |
| 3 | BUFFER NO. (ADDRESS) | BUFFER NO. (ADDRESS) |
| 4 | BUFFER NO. (ADDRESS) | BUFFER NO. (ADDRESS) |
| 5 | BUFFER NO. (ADDRESS) | BUFFER NO. (ADDRESS) |
| 6 | BUFFER NO. (ADDRESS) | BUFFER NO. (ADDRESS) |
| 7 | BUFFER NO. (ADDRESS) | BUFFER NO. (ADDRESS) |
| 8 | BUFFER NO. (ADDRESS) | BUFFER NO. (ADDRESS) |

FIG. 12

| PRIORITY | BUFFER INFORMATION | CHIP/BANK INFORMATION | WRITE-IN FLAG INFORMATION |
|---|---|---|---|
| 1 | BUFFER NO. (ADDRESS) | CHIP NO., BANK NO. ADDRESS | 1/0 |
| 2 | BUFFER NO. (ADDRESS) | CHIP NO., BANK NO. ADDRESS | 1/0 |
| 3 | BUFFER NO. (ADDRESS) | CHIP NO., BANK NO. ADDRESS | 1/0 |
| 4 | BUFFER NO. (ADDRESS) | CHIP NO., BANK NO. ADDRESS | 1/0 |
| 5 | BUFFER NO. (ADDRESS) | CHIP NO., BANK NO. ADDRESS | 1/0 |
| 6 | BUFFER NO. (ADDRESS) | CHIP NO., BANK NO. ADDRESS | 1/0 |
| 7 | BUFFER NO. (ADDRESS) | CHIP NO., BANK NO. ADDRESS | 1/0 |
| 8 | BUFFER NO. (ADDRESS) | CHIP NO., BANK NO. ADDRESS | 1/0 |

FIG. 13

| CHIP NO. | BANK NO. | BUFFER INFORMATION 1 | BUFFER INFORMATION 2 |
|---|---|---|---|
| 1 | 1 | BUFFER NO. (ADDRESS) | BUFFER NO. (ADDRESS) |
| 1 | 2 | BUFFER NO. (ADDRESS) | BUFFER NO. (ADDRESS) |
| 2 | 1 | BUFFER NO. (ADDRESS) | BUFFER NO. (ADDRESS) |
| 2 | 2 | BUFFER NO. (ADDRESS) | BUFFER NO. (ADDRESS) |
| 3 | 1 | BUFFER NO. (ADDRESS) | BUFFER NO. (ADDRESS) |
| 3 | 2 | BUFFER NO. (ADDRESS) | BUFFER NO. (ADDRESS) |
| 4 | 1 | BUFFER NO. (ADDRESS) | BUFFER NO. (ADDRESS) |
| 4 | 2 | BUFFER NO. (ADDRESS) | BUFFER NO. (ADDRESS) |

NON-VOLATILE SEMICONDUCTOR MEMORY DEVICE AND SEMICONDUCTOR DISK DEVICE

CROSS-REFERENCE TO RELATED APPLICATIONS

This application is a Continuation of application Ser. No. 10/975,818, filed Oct. 29, 2004, now U.S. Pat. No. 7,116, 586, which, in turn, is a continuation of application Ser. No. 10/786,007, filed Feb. 26, 2004 (now U.S. Pat. No. 6,813, 185), which is a Continuation of application Ser. No. 10/205, 426, filed Jul. 26, 2002 (now U.S. Pat. No. 6,714,452), which is a Divisional of parent application Ser. No. 09/758, 221, filed Jan. 12, 2001 (now U.S. Pat. No. 6,445,615), the entire disclosures of which are hereby incorporated by reference.

FIELD OF TILE INVENTION

The present invention relates to a non-volatile semiconductor memory device and a semiconductor disk device. Specifically, the invention relates to the technique useful for non-volatile memory devices that are capable of having blocks of stored information erased electrically at once (hereinafter referred to as "flash memory") and for semiconductor disk devices which use such flash memory.

BACKGROUND OF THE INVENTION

FIG. 1 shows an example of the conventional semiconductor disk device. This semiconductor disk device 99 is made up of a disk controller 1 and one or more chips of flash memory 3. The controller 1 includes a host interface logic circuit 14 a flash control interface logic circuit 17, I/O buffers 15 and 16, an MPU 12, an MPU interface logic circuit 13, and a data transfer logic circuit 11. It implements data writing to the flash memory 3 in response to a write request and for data 25 transferred from the host 2, which is a workstation, personal computer, or the like.

FIG. 2 shows an example of the arrangement of the flash memory 3. This example shows the arrangement including eight flash memory chips indicated by 31 through 38. The flash memory chips have individual lines 521 through 528 of chip select signals wired from the controller 1 (the chip select signal lines 521-528 are shown generically as a wiring 52 at the controller 1 and the interconnection is not shown). Another wiring 51 represents a data bus, address bus and various control signal lines, and it is a common wiring to all flash memory chips. In other words, the data-pin, the address pin, and the control signal lines other than the wiring 52 have in common the eight flash memory chips, and for example, a signal line A0 in the address bus is connected with each terminal A0 of the eight flash memory chips.

In this arrangement, the controller 1 controls each flash memory chip by selecting a chip in accordance with the chip select signal end issuing a command and address for data to be written.

FIG. 3 shows the write operation of the conventional semiconductor disk device which is arranged as shown in FIG. 2. The case of sequential and cyclic data writing to the flash memory chips 31-38 is shown by the flow chart.

Each block STSn (n=31,32, . . . ,38) is the operation of the controller 1 to check the operational state of a flash memory chip n, and it branches in the direction of "Ready" if the chip is in a Ready status or in the direction of "Busy" if the chip is in a Busy status. Each block DTn (n=31,32, . . . ,38) is the operation of the host 2 to issue a write command to a flash memory chip n and to issue a command of initiating the automatic write operation within the chip for data to be written which is held by the data buffer. Following the operation of DTn, the flash memory chip n writes the data to memory cells based on the in-chip automatic write operation, and it stays in Busy status until the end of the writing.

The foregoing arrangement and operation enable the transfer of data and the issuance of a write command to the next flash memory chip during the automatic write operation within the former chip, and accomplishes the speed-up of data writing based on the parallel writing to multiple flash memory chips.

Recently, an efficient flash memory 15 access method has been devised based on the early execution of a write operation for a flash memory chip which is detected early to be Ready, as illustrated by FIG. 10 of Japanese Patent Unexamined Publication No. H10-63442.

This patent publication No. H10-63442, shown by FIG. 10, 20 is a semiconductor disk having 16 flash memory chips, and for one pattern of the write operation, it can proceed to the write operation for any flash memory chip which becomes Ready among three flash memory chips having high, medium and low write-in priority levels.

However, a description is given of the problem which occur when the write operation is performed with the aforementioned configuration.

The case is considered in which, as shown in FIG. 4, a flash memory chip indicated by chip No. 1 (hereinafter, called chip 1) is a high write-in priority chip, chip 2 is a medium write-in priority chip and chip 3 is a low write-in priority chip. When chips No. 8 and No. 13 are in Ready status and other chips than the chips No. 8 and No. 13 are in Busy status, the write operation is performed according to the flow chart in FIG. 10 of the patent publication No. H10-63442. Although the chip in which the write operation is performed has its execution ability at the steps S19, S21 and S23 as in the FIG. 10, the decision of the execution ability is performed only for a high priority chip (chip 1) in the step S19, for a medium priority chip (chip 2) in the step S21, and for a low priority chip (chip 3) in the step S23. Despite the existence of chips (chips No. 8 and No. 13) being in the Ready status where the write operation is available, the decision that the write operation is unavailable is made and while the write operation is not performed, the next step S25 is carried out.

In other words, in the conventional configuration, even if one or more flash memory chips exist in a Ready status after the write operation is completed, the problem is raised in which the next write operation can not be performed immediately.

Recently, in Symp. on VLSI Circuits Tech. Digest, 1996, pp. 174-175, a flash memory having multiple banks (hereinafter called "multi-bank flash memory") as a scheme of increasing the number of bits of simultaneous writing on a flash memory chip has been introduced. However, the multi-bank flash memory chip has Busy status during the writing of data to memory cells of one bank, while other banks are left inaccessible. Therefore, this flash memory is problematic in that individual banks cannot be controlled separately from the outside.

SUMMARY OF THE INVENTION

The present invention is intended to deal with the foregoing situation, and its prime object is to provide a semiconductor disk device which has a plurality of flash memory chips or one or more multi-bank flash memory chips, and which is capable of writing immediately to a bank of flash memory chips or multi-bank flash memory chips which have reached Ready status, and to provide a non-volatile semiconductor memory device having a multi-bank flash memory capable of having its banks controlled separately from the outside.

These and other objects and novel features of the present invention will become apparent from the following description of the specification, taken in conjunction with the accompanying drawings.

In the present invention disclosed in this specification, other objects and novel features are summarized as follows. The inventive device has a plurality of banks, allows each bank to operate independently to write data from its data register to memory cells, and is capable of transferring write data from the outside to the data register of each bank, even during the write operation of other banks from the data register to memory cells.

The inventive device has a bank selection register which releases a signal for designating one of the banks in accordance with the bank status, which is established by an external input signal.

The device has a plurality of input terminals of bank enable signals and produces an internal control signal which designates one of the banks based on the combination of the bank enable signals. Data to be written from the outside is transferred to the data register of the designated bank. The device can indicate the status of the designated bank in response to the external status check command. The external read command, erase command, write command and status polling command act on a designated bank.

The inventive device incorporates one or more non-volatile semiconductor memory devices and provides access to said non-volatile semiconductor memory devices in response to disk access requests from a host, wherein the non-volatile semiconductor memory devices have a total number (Nb) of banks of two or more. The inventive device also includes a controller device, which is connected to the non-volatile semiconductor memory devices, adapted to control the non-volatile semiconductor memory devices, has a data buffer with a storage capacity which is greater than the total storage capacity (A) of the data registers included in the non-volatile semiconductor memory devices, and has a buffer control table which temporarily stores the correspondence between the data held by the data buffer and the non-volatile semiconductor memory devices to which the data is to be written.

The data buffer has a storage capacity of 2A or more. The data buffer can be addressed for its divided areas of at least Nb in number. The buffer control table stores for each area of data buffer an identifier indicative of the destination bank of the data to be written, which is held in the buffer area, and the device initiates the data writing to the non-volatile semiconductor memory devices, while transferring data from a buffer area, which is relevant to a destination which has become Ready, to the destination.

Information stored for each area of the buffer control 20 table contains priority levels of the transfer of data from the area to the non-volatile semiconductor memory device. Information stored for each area of data buffer includes information which indicates as to whether data held in the area has already been transferred to the non-volatile semiconductor memory device. The buffer control table stores, for each bank of the non-volatile semiconductor memory device, information for addressing a data buffer area, and the addressed area holds data to be transferred to the bank, so that data from a bank which has become Ready is transferred and written to the non-volatile semiconductor memory device. Information of each bank stored in the buffer control table includes address information of multiple data buffer areas indicative of the order of transfer to the bank.

BRIEF DESCRIPTION OF THE DRAWINGS

FIG. 4 is a diagram used to explain the problem involved in the conventional fast write operation;

FIG. 7 is a table showing an example of the arrangement of the buffer control table of the inventive semiconductor disk device;

FIG. 9 is a table showing another example of the arrangement of the buffer control table of the inventive semiconductor disk;

FIG. 12 is a table showing another example of the arrangement of the buffer control table of the inventive semiconductor disk device;

FIG. 13 is a table showing another example of the arrangement of the buffer control table of the inventive semiconductor disk device;

DETAILED DESCRIPTION OF THE PREFERRED EMBODIMENTS

Preferred embodiments of the present invention will be explained with reference to the drawings.

Figure 5:
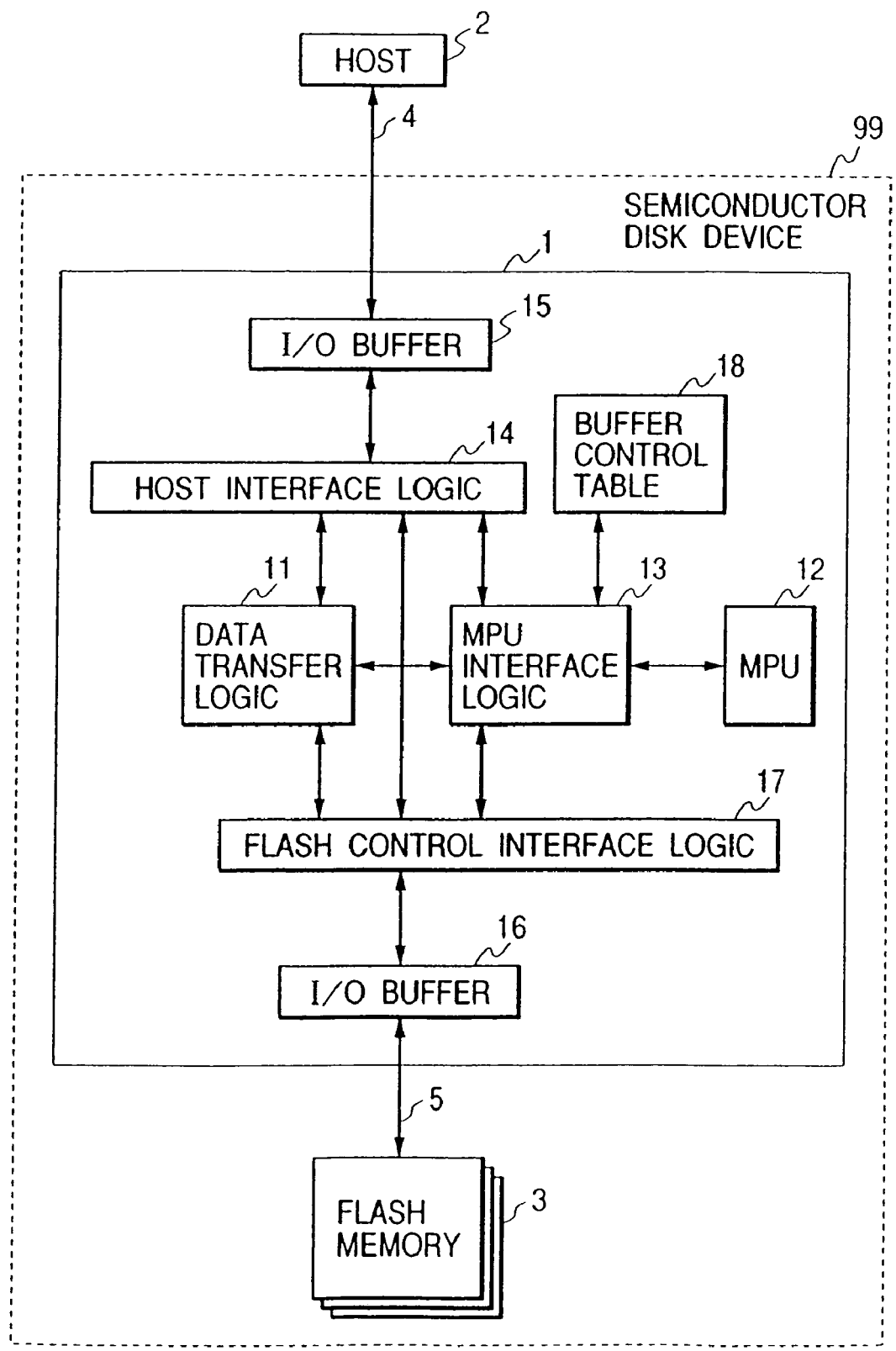
FIG. 5 is a block diagram showing an example of the semiconductor disk device based on this invention.

FIG. 5 shows by block diagram the arrangement of the semiconductor disk device based on an embodiment of this invention. This semiconductor disk device 99 is made up of a flash memory 3 and a controller 1. The flash memory 3 is formed of multiple flash memory chips or one or more multi-bank flash memory chips. The controller 1 includes a host interface logic circuit 14, a flash control interface logic circuit 17, I/O buffers 15 and 16, an MU 12, an MPU interface logic circuit 13, a data transfer logic circuit 11, and a buffer control table 18, and it implements the data writing to the flash memory 3 in response to a write 20 request and data transfer from a host 2, which is a workstation, personal computer, or the like.

The MPU interface logic circuit 13 is an interface circuit which connects the MPU 12 to the host interface logic circuit 14, flash control interface logic circuit 17, and the data transfer logic circuit 11, and it functions to drive various control signals and transfer data.

The MPU 12 functions to control the operation of the whole semiconductor disk device, and, specifically, it implements the address conversion from the host address which is used by the host 2 to provide a disk access into the memory address which is used to provide access to the flash memory 3 and controls the access operation for a selected flash memory chip.

A wiring 4 (hereinafter called "external bus" 4) is used to connect the controller 1 to the host 2, and it includes a data bus, address bus and various control signal lines.

The host interface logic circuit 14 is an interface which conforms to the specifications of IDE or CMCIA, for example, and it is connected to the host 2 via the external bus 4.

A wiring 5 (hereinafter called "memory bus" 5) is used to connect 15 the controller 1 to the flash memory 3, and it includes an 8-bit I/O data/address bus and various control signal lines.

The flash control interface logic circuit 17 is a hardware logic which implements the access control of the flash memory under the control of the MPU 12, and it functions to drive various control signals for the flash memory 3 thereby to transact data, with the flash memory 3 via the memory bus 5.

The I/O buffers 15 and 16 are input/output buffers connected to the external bus 4 and memory bus 5, respectively.

The data transfer logic circuit 11 has a data buffer for holding data to be written, which is transferred from the host 2, and it functions to transfer the data held by the data buffer to the flash memory 3 via the flash control interface logic circuit 17 by being controlled by the MPU 12.

The buffer control table 18 is a temporary memory for holding information which is used to control the data buffer in the data transfer logic circuit 11.

It should be noted that the present invention is not confined to the arrangement of FIG. 5, but it is possible to provide a variant arrangement of a semiconductor disk device in which the data transfer logic circuit 11 is included in the MPU interface logic circuit 13.

Moreover, instead of the arrangement in which the semiconductor disk device is made up of the controller 1 and flash memory 3, a variant arrangement, which is assumed to be within the scope of the present invention, is to arrange part or all of the controller 1 as part of the host 2, for example, so that the semiconductor disk is formed of only the flash memory 3 or the flash memory 3 and part of the controller 1.

Moreover, it is not obligatory for the componential members of the controller 1 to be formed on the same semiconductor substrate, but it is possible to form the MPU 12 and the data buffer of the data transfer logic circuit 11 on separate semiconductor substrates or incase these members in separate packages.

The flash memory chips or multi-bank flash memory chips which constitute the flash memory 3 are flash memories of the command control type in which all of their operations can be specified by external commands, with the read and write operations taking place in a certain unit data size (it will be called "page"), and the flash memory chip has a data register for one page or the multi-bank flash memory chip has a data register for pages that are equal in number to the number of banks.

The data write operation from the data register to the memory cell array can take place automatically without external control, and the flash memory chip has a Busy status during the automatic data writing (the behavior of the multi-bank flash memory will be explained later). The external system can confirm the end of the automatic data writing by checking the ready/busy signal released by the chip or based on the status polling.

Embodiment 1

Figure 1:
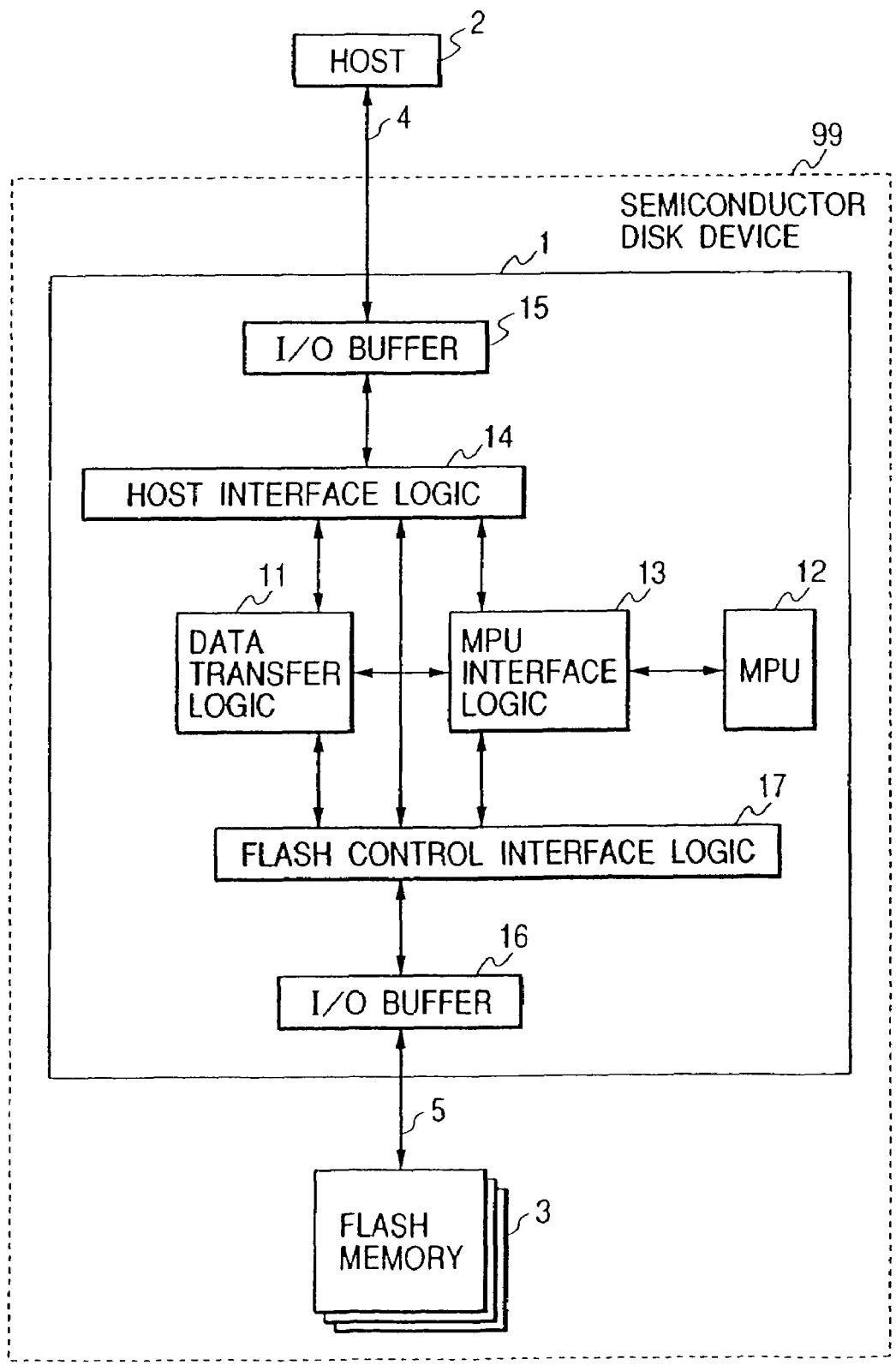
FIG. 1 is a block diagram of the conventional semiconductor disk device.
Figure 2:
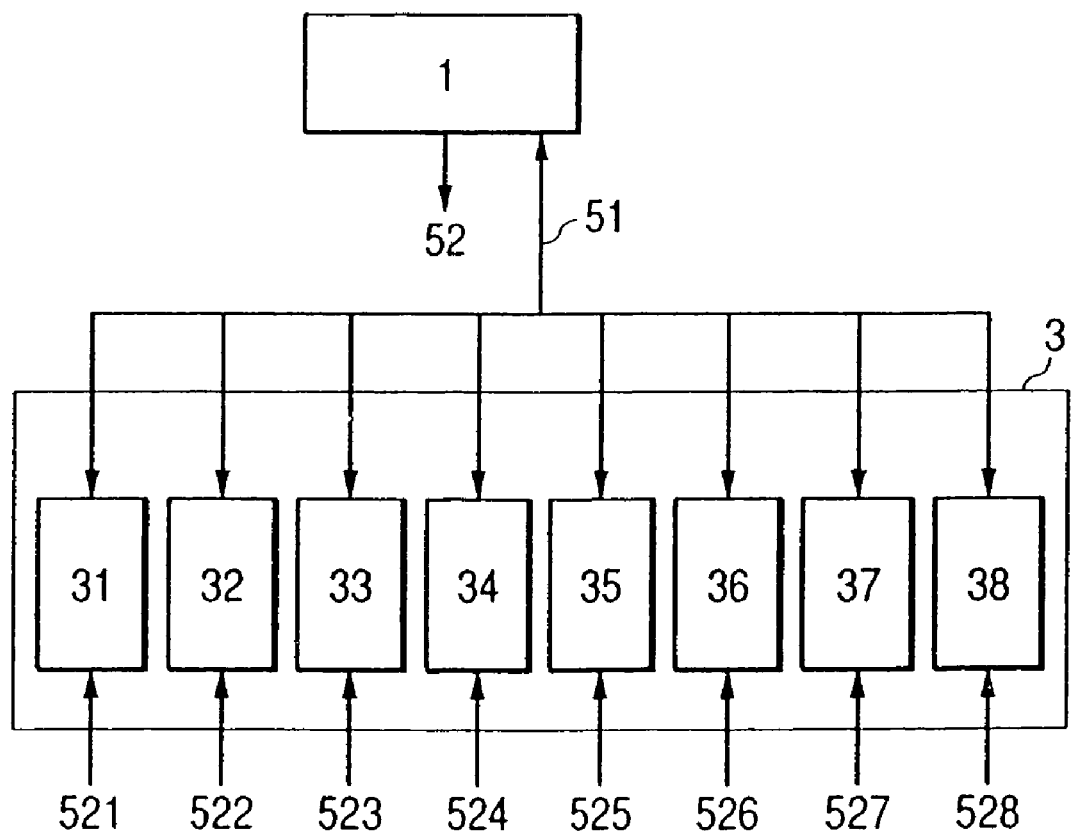
FIG. 2 is a block diagram showing the arrangement of the non-volatile semiconductor memory device used for the semiconductor disk.
Figure 3:
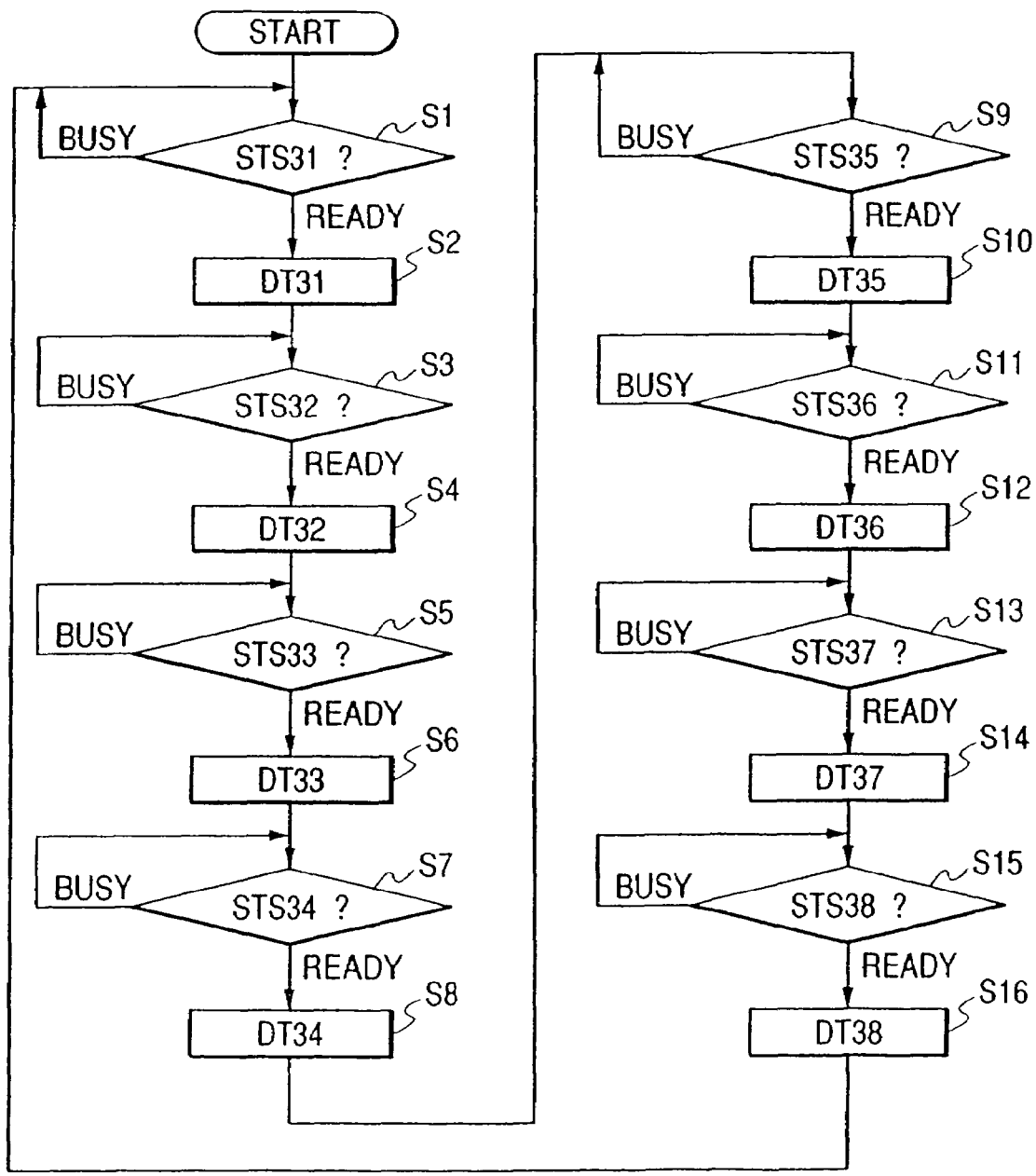
FIG. 3 is a flowchart showing the write operation of the conventional semiconductor disk.

The first embodiment of this invention will now be explained. In this embodiment, the flash memory 3 shown in FIG. 5 is formed of eight flash memory chips 31 through 38, configured as shown in FIG. 2. A memory bus 5 connects the controller and the memory chips, as shown in FIG. 2. Lines 521-528 of chip select signals are wired from the controller 1 to the individual flash memory chips separately. The chip select signal lines 521-528 are shown generically as a wiring 52 at the controller 1, and the interconnection is not shown. Another wiring 51 represents an 8-bit I/O data/address bus and various control signal lines connected to the control signal terminals of the flash memory chips, and it is common to all flash memory chips.

In this arrangement of flash memory chips, the address, data, and various control signals sent from the controller 1, to the flash memory 3 over the wiring 51 act only on a chip selected by a chip select signal, so that each flash memory chip is controlled separately.

Figure 6A:
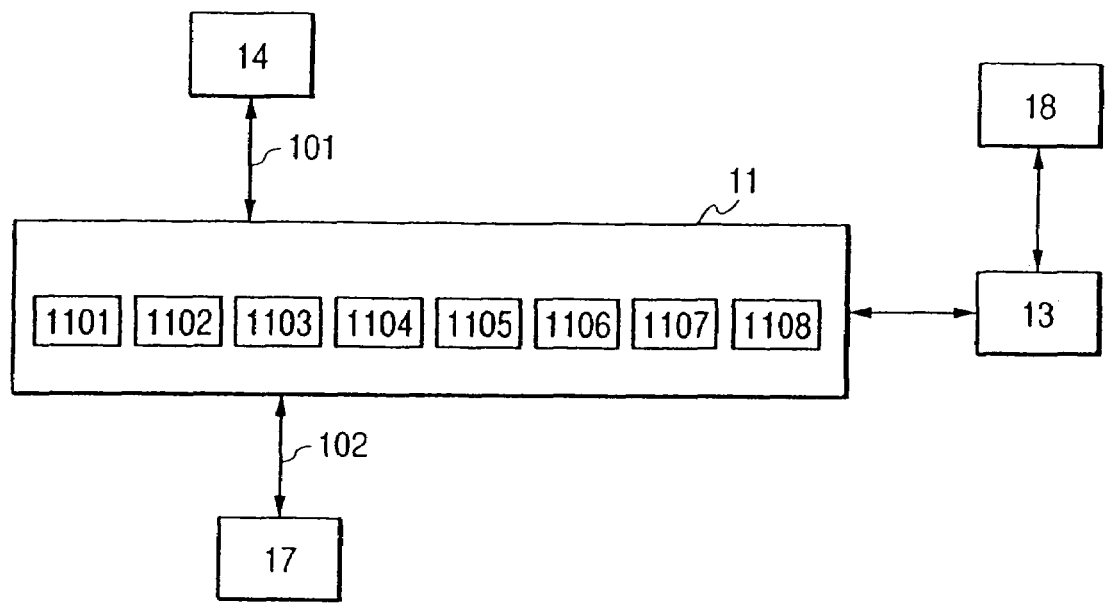
FIGS. 6A and 6B are block diagrams showing examples of the arrangement of the data buffer of the inventive semiconductor disk device.

In this embodiment, the data transfer logic circuit 11 is equipped with eight data buffers 1101 through 1108, each having a storage capacity of one page of the flash memory as shown in FIG. 6A. These eight data buffers may not be separated physically, but there can be a buffer memory which has a capacity of 8 pages, i.e., the total capacity of the data registers of the eight flash memory chips which form the flash memory 3, or more, and can be addressed logically.

In this embodiment, the buffer control table 18 assigns eight priority levels to the eight buffers, and each buffer with a certain priority level has a buffer number, chip number, memory address to be specified at data writing, and write-in flag information, as shown in FIG. 7. The buffer number is address information for pointing to the location for storing data of one page in the buffer area, i.e., one of the data buffers 1101-1108. The chip number is an identifier for the access to one of the eight flash memory chips. The write-in flag information is used to indicate whether the contents of the data buffer have been transferred to the flash memory 3, e.g., it has a value of "0" if data has been transferred or "1" if data has not been transferred.

Data transfer from the host 2 to the controller 1 takes place for a data buffer with the highest priority level among data buffers, having write-in flag information of "0", and as a result, that data buffer will have its write-in flag information set to "1".

There can be a variant arrangement in which the buffer control table 18 does not fill the information fields for data buffers having write-in flag information of "0", i.e., data buffers which already have their contents already transferred to the flash memory 3. Namely, the write-in flag information can be substituted by the presence or absence of information in the buffer information fields.

Figure 8:
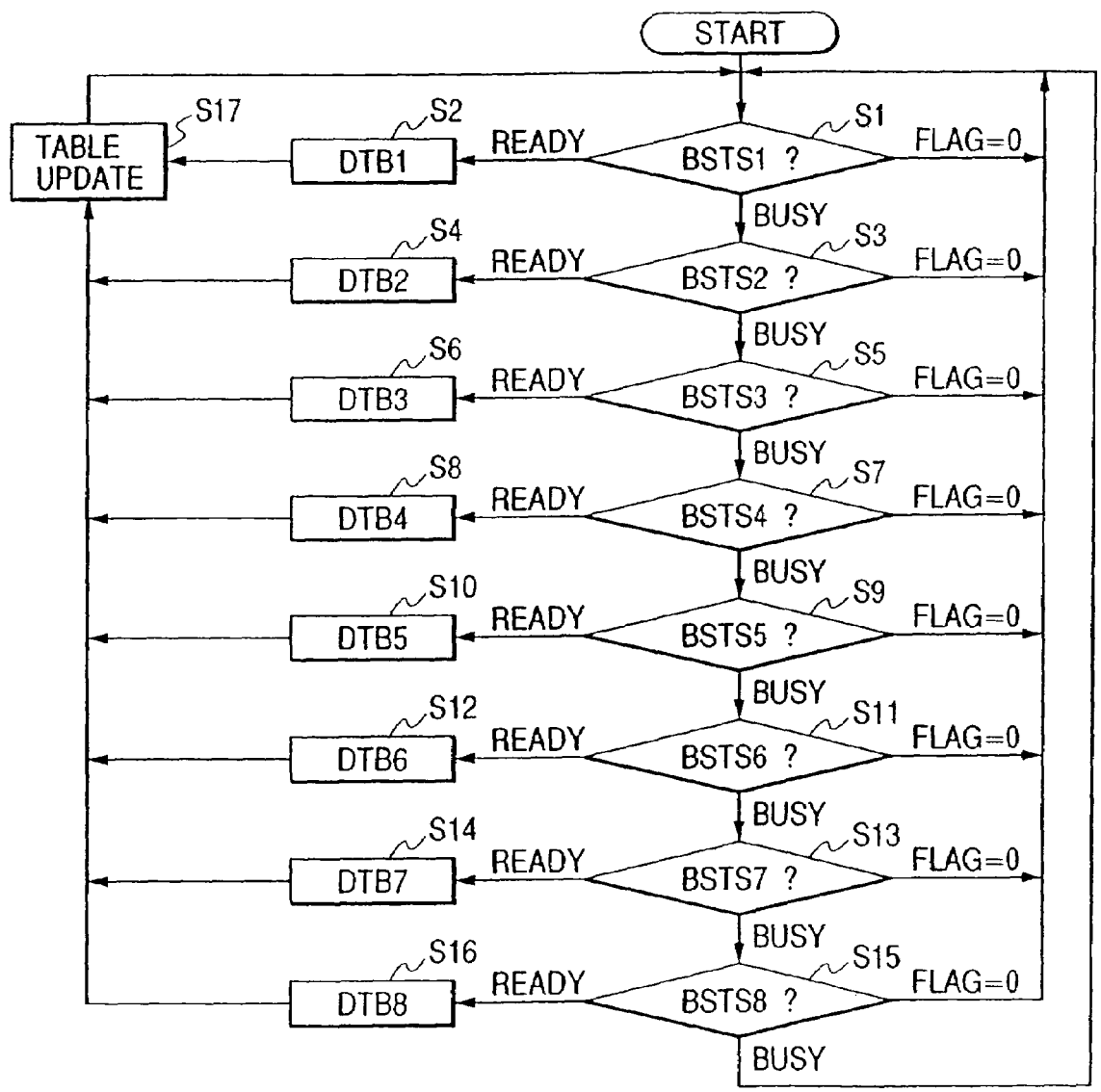
FIG. 8 is a flowchart showing an example of the write operation of the inventive semiconductor disk.

FIG. 8 shows by flowchart an example of the write operation of the inventive semiconductor disk device in the case in which the contents of the buffer control table 18 shown in FIG. 7 are used. Shown in this example is the operation with successive data transfer from the host to the semiconductor disk after the initiation of data writing.

Each block BSTSn (n=1,2, . . . ,8) indicates the operation in which the information field with a priority level n in the buffer control table 18 is checked, and it branches to the direction of "Flag=0" if the write-in flag information is "0", to the direction of "Ready" if the flash memory chip pointed by the chip information has Ready status, or to the direction of Busy if the chip has "Busy" status.

Each block DTBn (n=1,2, . . . ,8) indicates the operation of the controller 1 to issue a write command to the designated flash memory chip in accordance with the priority level n in the buffer control table 18, and to issue commands of initiating the transfer of write data held by the data buffer and the automatic writing within the chip. Following the operation of DTBn, the flash memory chip writes the data in the data register to the memory cell array based on the in-chip automatic write operation, and it stays in Busy status until the end of writing. The block of Table Update is the operation for revising the buffer control table 18 after the transfer of data from the controller 1 to the flash memory 3.

Based on the operational procedure shown in FIG. 8, each 15 flash memory chip with a priority level indicated by the buffer control table 18 is checked for its write-in flag information and Ready/Busy status. Specifically, if the write-in flag information is "0", the operation returns to check the information of priority level 1, or if the write-in flag information is "1" and the flash memory chip is Ready, it transfers the write date. held by the data buffer, revises the buffer control table 18 and returns to the checking of information of the priority level 1. Otherwise, if the write-in flag information is "1" and the flash memory chip is Busy, the operation proceeds to the checking of information of the data buffer having the 1-level lower priority. These operations are repeated to write data to the semiconductor disk device.

According to the arrangement and operation of this embodiment described above, it becomes possible for a flash memory chip among all chips that has finished the writing early and become Ready to proceed immediately to the next data writing, whereby an efficient write operation can be accomplished, without wasting time.

Figure 6B:
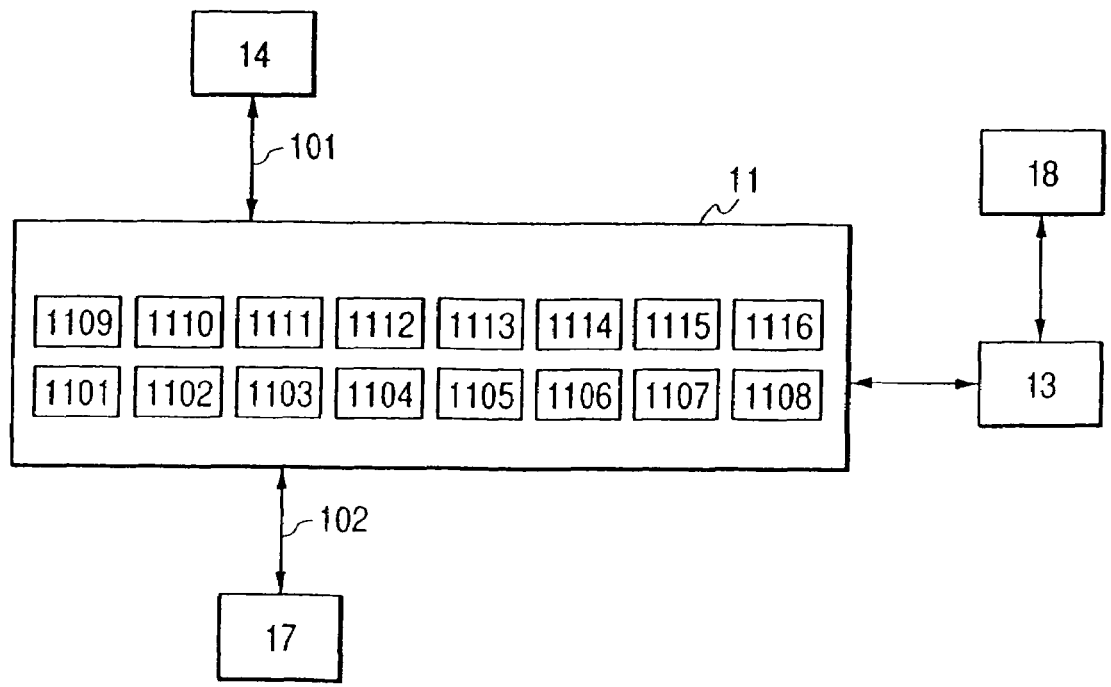

Although in this embodiment, eight flash memory chips 10 are provided with eight data buffers 1101-1108, each having a 1-page capacity, a variant arrangement based on this invention is to provide the eight flash memory chips with 16 data buffers 1101-1116, as shown in FIG. 6B. This arrangement further eliminates the wasting of time which results from a flash memory chip which has finished the writing twice before other flash memory chip finishes the writing once.

Similarly, providing the data buffers with an increased storage capacity allows for a semiconductor disk device which virtually wastes no time even in the presence of a large disparity of the time of write operation among the flash memory chips.

Although this embodiment describes eight flash memory chips, the present invention is not confined to this arrangement.

Although in this embodiment, there is no fixed combination of the buffer number and the chip number in the buffer control table 18, an alternative design is to provide a fixed chip number for each buffer number so that each chip has a certain data buffer.

Embodiment 2

Next, the second embodiment of this invention will be explained. The flash memory 3 of this embodiment has the same arrangement as that of the first embodiment, shown in FIG. 5.

In this embodiment, the data transfer logic circuit 11 is equipped with 16 data buffers 1101 through 1116, each having a capacity of one page of the flash memory, as shown in FIG. 6B. These 16 data buffers may not be separated physically, but can be a buffer memory which can be addressed logically.

In this embodiment, the buffer control table 18 has fields of buffer information 1 and buffer information 2 for the eight flash memory chips, as shown in FIG. 9. The buffer information 1 is used to point a data buffer which holds data to be written immediately to the respective flash memory chip, and the buffer information 2 is to point a data buffer which holds data to be written next to the data indicated by the buffer information 1. In case there is no relevant data to be written, the buffer information field may be filled with data or flag information indicative of "empty".

The flash memory address to which write data is written may be stored together with the buffer information in the buffer control table 18, or may be stored together with data in the data buffer which is pointed by the buffer information. The chip number is an identifier for the access to one of the eight flash memory chips.

Figure 10:
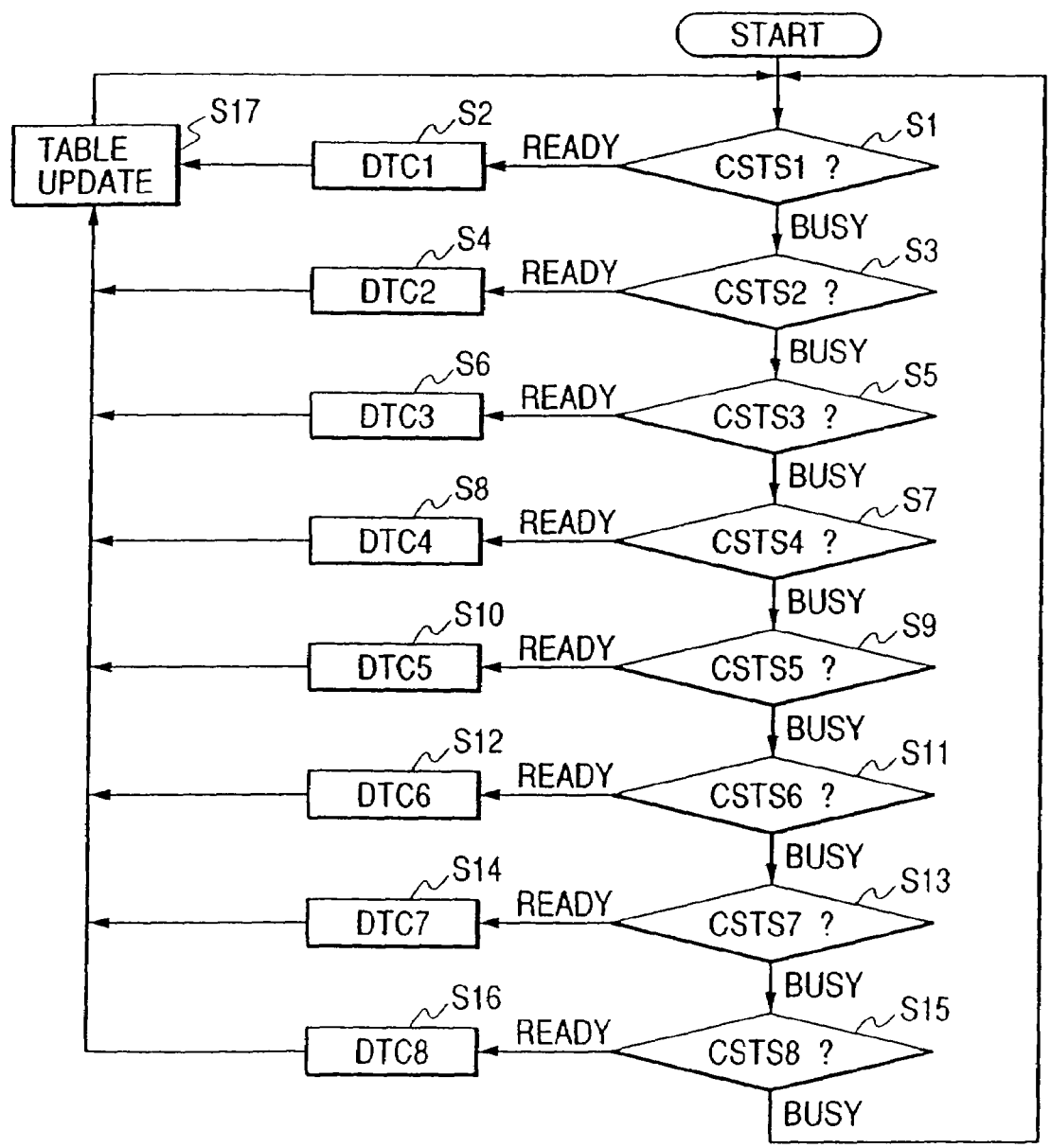
FIG. 10 is a flowchart showing another example of the write operation of the inventive semiconductor disk.

FIG. 10 shows by flowchart an example of the write operation of the inventive semiconductor disk device in the case in which the above-mentioned buffer control table 18 is used. Shown in this example is the operation with successive data transfer from the host to the semiconductor disk after the initiation of data writing.

Each block CSTSn (n=1,2, . . . ,18) illustrates is the operation to check 10 the information field indicated by chip number n in the buffer control table 18, and it branches to the direction of Ready if the buffer information 1 is not "empty" and the designated flash memory chip has Ready status, or to the direction of Busy if it has Busy status.

Each block DTCn (n=1,2, . . . ,8) is the operation of the controller 1 to issue a write command to the designated flash memory chip in accordance with the chip number n in the buffer control table 18 and to issue commands of initiating the transfer of data held by the data buffer pointed by the buffer information 1 and the automatic writing within the chip. Following the operation of DTCn, the chip n writes the data in the data register to the memory cell array based on the in-chip automatic write operation, and it stays in busy status until the end of the writing.

The block of Table Update is the operation for revising 25 the buffer control table 18 after the transfer of write data from the controller 1 to the flash memory 3.

Based on the operational procedure shown in FIG. 10, each flash memory chip pointed by the chip number in the buffer control table 18 is checked for its Ready/Busy status. Specifically, if the chip is Ready, the operation transfers the data which is held by the data buffer, revises the buffer control table 18, and proceeds to the checking of the information of chip No. 1. otherwise, if the chip is Busy, the operation proceeds to the checking of information of the next chip number. These 10 operations are repeated to write data to the semiconductor disk device.

Although FIG. 10 shows the operational procedure in which the revision of the buffer control table 18 is always followed by the status check of chip No. 1, a variant procedure is used to check the status of chip No. (n+1) after the revision of the buffer control table 18 following the transfer of data to chip No. n. The operation proceeds to the checking of chip No. 1 if n is the last number.

According to the arrangement and operation of this embodiment described above, it becomes possible for a flash memory chip among all chips that have finished the writing early and have become Ready to proceed immediately to the next data writing, whereby an efficient write operation without time wasting can be accomplished without wasting time.

Although in this embodiment, the eight flash memory chips are provided with 16 data buffers 1101-1116, each having a 1-page capacity, a variant arrangement based on this invention is to provide FIFO (first-in-first-out) data buffers of an arbitrary number which is greater than the number of flash memory chips, and the present invention is not confined in terms of the number of flash memory chips and the number of data buffers.

Although in this embodiment, there is no fixed combination of the buffer number and the chip number in the buffer control table 18, an alternative design is to provide a fixed chip number for each buffer number so that each chip has a certain data buffer.

Embodiment 3

Figure 11:
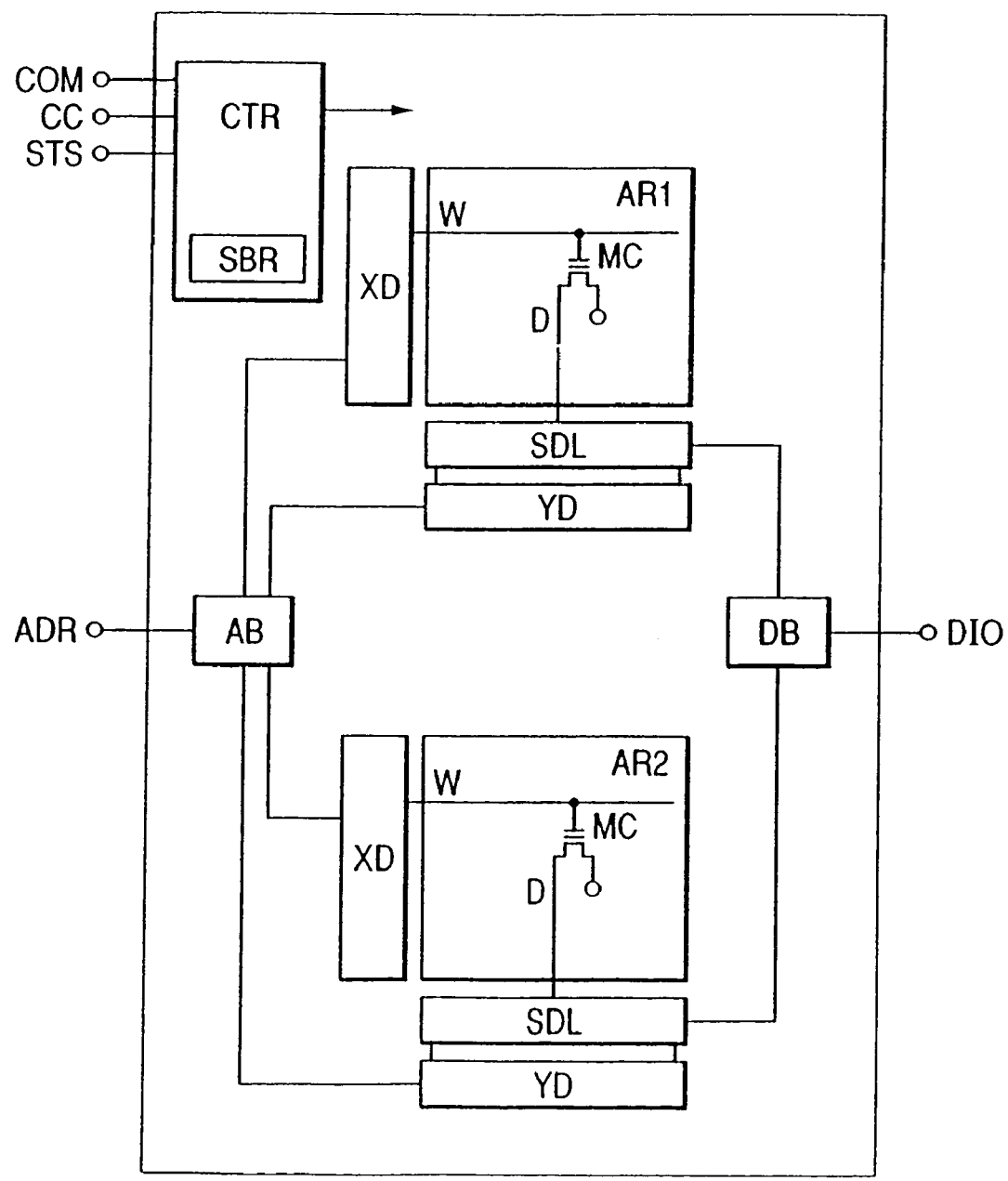
FIG. 11 is a block diagram showing an example of the arrangement of the non-volatile semiconductor memory device which has multiple banks based on this invention.

FIG. 11 shows an example of the arrangement of the multi-bank flash memory based on this invention. The flash memory has an address input terminal ADR, a control command input terminal CON, a status output terminal STS for indicating the status of the semiconductor memory device to the outside, a set of control signal terminals C (including a chip enable signal terminal), a data input/output terminal DIO, and power supply terminals (not shown). With the provision of a multiplexer circuit within the chip, the ADR, COM, DIO and STS signals can share terminals.

The flash memory incorporates an internal control signal generation circuit CTR, a data input/output buffer circuit DB, an address buffer circuit AB, memory arrays AR1 and AR2 having memory cells MC at the intersections of word lines W and bit lines D (only one memory cell MC, word line W, and bit line D are shown in each memory cell array for the sake of simplicity), sense circuits and data registers SDL, X-address decoder circuits XD which decode the address signal to select word lines W of the arrays AR1 and AR2, Y-address decoder circuits YD which decode the address signal to select bit lines D of the arrays AR1 and AR2, and a bank selection register SBR. The sense circuit and data register SDL can be simply a sense circuit having a data holding function.

When the bank selection register SBR is used, there is an advantage that the least control signal for controlling the flash memory chip is required.

The memory cell arrays AR1 and AR2 are designed to operate independently from each other as independent banks.

The non-volatile semiconductor memory device of this arrangement has its operation controlled based on the distribution to the componential circuits of the internal control signals produced by the internal control signal generation circuit CTR depending on the control signal CC, input command, and the states of the circuits.

The bank selection register SBR is designed to have at least two states and produce a signal in the first state to indicate that AR1 is the selected bank, and produce a signal in the second state to indicate that AR2 is the selected bank. The internal control signal generation circuit CTR receives from the outside the read, write, erase, and status polling commands and the address signal for the bank pointed by the bank selection register SBR, and produces and sends the internal control signals to the bank.

Specifically, when the bank AR1 is pointed by the bank selection register SBR, it is possible to distinguish the input command to be a command for the bank AR1, so that it acts on the bank AR1 irrespective of the Ready/Busy state of the bank AR2. For example, during the write operation of data from the data register SDL to the memory cell array of the bank AR2, it is possible to transfer data from the outside to the data register of the bank AR1.

For the above-mentioned performance, the multi-bank flash memory of this embodiment is capable of reversing the bank pointing information provided by the bank selection register SBR.

It is possible to alter the information held by the bank selection register SBR in response to an external command for example, and once the information is set to the register SBR, it is possible to keep the information unchanged until other information is set. It is possible to read out the contents of the bank selection register SBR in response to an external command.

It is possible to append the bank selecting information as an argument to the read, write, and status polling commands so as to set the information to the bank selection register SBR.

Based on the above-mentioned arrangement, it becomes possible to control multiple banks of one multi-bank flash memory chip separately from the outside.

Although this embodiment demonstrates the case of two banks provided for one multi-bank flash memory chip, the present invention is not confined to this arrangement. The invention is applicable to the cases of three or more banks in one multi-bank flash memory chip by designing the bank selection register to have a greater number of states than the number of banks.

The third embodiment of this invention using the multi-bank 10 flash memory shown in FIG. 11 will now be explained. In this embodiment, the flash memory 3 of FIG. 5 is formed of four flash memory chips arranged as shown in FIG. 17, although the present invention is not confined to this arrangement.

Figure 17:
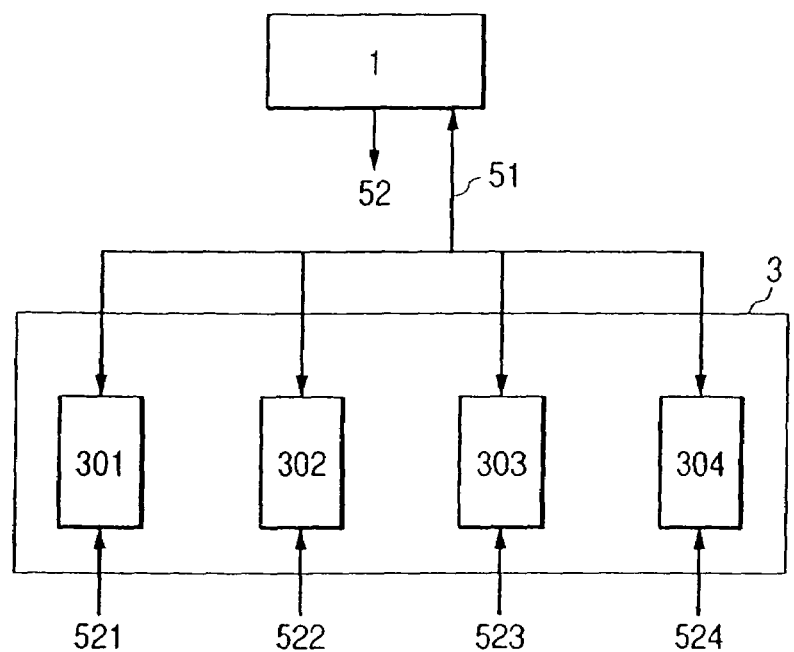
FIG. 17 is a block diagram showing another example of the arrangement of the non-volatile semiconductor memory device based on this invention.

The memory bus 5, shown in FIG. 5, connects the controller 15 to the memory chips as shown in FIG. 17. Lines 521 through 524 of chip select signals are wired from the controller 1 to the individual flash memory chips separately. The chip select signal lines 521-528 are shown generically as a wiring 52 at the controller 1, and the interconnection is not shown. Another wiring 51 represents an 8-bit I/O data/address bus and various control signal lines connected to the control signal terminals of the flash memory chips, and it is common to all flash memory chips.

In this arrangement, the address, data, and various control signals sent from the controller 1 to the flash memory 3 over the I/O data/address bus of the wiring 51 act only on a chip selected by a chip select signal, so that each flash memory chip is controlled separately.

In this embodiment, the data transfer logic circuit 11 5 is equipped with eight data buffers 1101 through 1108, each having a capacity of one page of the flash memory, as shown in FIG. 6A. These eight data buffers may not be separated physically, but can be a buffer memory which has a capacity of 8 pages, i.e., the total capacity of the data registers of the eight flash memory chips which form the flash memory 3, or more, and can be addressed logically.

In this embodiment, the buffer control table 18 assigns priority levels 1 through 8 to the eight data buffers, with each column of the table having fields of the buffer number, chip number, bank number, memory address to be specified at data writing, and write flag information, as shown in FIG. 12. The buffer number is address information for pointing the location for storing data of one page in the data buffer area, i.e., one of the data buffers 1101-1108. The chip number is an identifier for the access to one of the four multi-bank flash memories, the bank number is an identifier for the access to one of the two multi-bank flash memories, and the write-in flag information is used to indicate whether the contents of the data buffer have been transferred to the flash memory 3, e.g., it has a value of "0" if data has been transferred or "1" if data has not been transferred yet.

Data transfer from the host 2 to the controller 1 takes place for a data buffer with the highest priority among data buffers having write-in flag information of "0", and that data buffer will have its write-in flag information set to "1".

There can be a variant arrangement in which the buffer control table 18 does not fill the information fields for data buffers having write-in flag information of "0", i.e., data buffers which already have their contents transferred to the flash memory 3. Namely, the write-in flag information can be substituted by the presence or absence of information in the buffer information fields.

The write operation of the inventive semiconductor disk device in the in which the buffer control table 18 is used based on the same procedure as the first embodiment, shown in FIG. 8.

Each block BSTSn (n=1,2, . . . ,8) indicates the operation in which the information field with priority level n in the buffer control table 18 is checked, and it branches to the direction of Flag=0 if the write-in flag information is "0", to the direction of Ready if the bank of the specified channel number and bank number has Ready status, or to the direction of Busy if the bank has Busy status. Each block DTBn (n=1,2, . . . ,8) indicates the operation of the controller 1 to issue a write command to the specified bank of the specified flash memory chip in accordance with the priority level n in the buffer control table 18, and to issue commands to initiate the transfer of data held by the data buffer and the automatic writing within the chip. Following the operation of DTBn, the bank of the flash memory chip writes the data in the data register to the memory cell array based on the in-chip automatic write operation, and it stays in Busy status until the end of the writing.

The block of Table Update indicates the operation for revising the buffer control table 18 after the transfer of write data from the controller 1 to the flash memory 3.

Based on the operational procedure shown in FIG. 8, the specified bank of the specified multi-bank flash memory chip with a priority level indicated by the buffer control table 18 is checked for its write-in flag information and Ready/Busy status. Specifically, if the write-in flag information is "0", the operation returns to the checking of information with priority level 1, or if the write-in flag information is "1" and the bank is Ready, the operation transfers the data which is held by the data buffer, revises the buffer control table 18, and proceeds to the checking of the information with priority level 1. Otherwise, if the write-in flag information is "1" and the bank is Busy, the operation proceeds to the checking of the information of the next lower priority. These operations are repeated to write data to the semiconductor disk device.

According to the arrangement and operation of this embodiment described above, it becomes possible for a flash memory chip among all chips that has finished the writing early and become Ready to proceed immediately to the next data writing, whereby an efficient write operation can be accomplished without wasting time.

Although in this embodiment, the four multi-bank flash memory chips, each having two banks, are provided with eight data buffers 1101-1108 each having a 1-page capacity, a variant arrangement based on this invention provides 16 data buffers 1101-1116, as shown in FIG. 6B, and in this case, it becomes possible to eliminate the wasting of time which occurs when a bank which has finished the writing twice before another bank finishes the writing once.

Similarly, providing the data buffers with an increased storage capacity results in a semiconductor disk device which is virtually rid of time wasting even in the presence of a large disparity in the time of write operation among the banks.

Even though this embodiment shows the case of four flash memory chips, the present invention is not confined to this arrangement.

Although in this embodiment, there is no fixed combination between the buffer number and the chip number, and the bank number in the buffer control table 18, an alternative design provides a fixed combination of the chip number and bank number for each buffer number so that each bank has a certain data buffer.

Embodiment 4

Next, the fourth embodiment of this invention, which uses 25 the multi-bank flash memory shown in FIG. 11, will be explained. In this embodiment, the flash memory 3 of FIG. 5 has the same arrangement as in the third embodiment.

The data transfer logic circuit 11 is equipped with 16 data buffers 1101 through 1116 each having a capacity of one 5 page of the multi-bank flash memory, as shown in FIG. 6B. These 16 data buffers may not be separated physically, but can be constructed as a buffer memory which can be addressed logically.

In this embodiment, the buffer control table 18 has fields of buffer information 1 and buffer information 2 for two banks of each multi-bank flash memory chip, as shown in FIG. 13. The buffer information 1 is to point a data buffer which holds data to be written immediately to the respective bank, and the buffer information 2 is to point a data buffer which holds data to be written next to the data indicated by the buffer information 1. In case there is no relevant data to be written, the buffer information field may be filled with data or flag information indicative of "empty".

The multi-bank flash memory address to which write data is written may be stored together with the buffer information in the buffer control table 18, or may be stored together with the write data in the data buffer which is pointed by the buffer information. The chip number is an identifier for the access to one of the four flash memory chips, and the bank number is an identifier for the access to one of the two banks of multi-bank flash memory.

Figure 14:
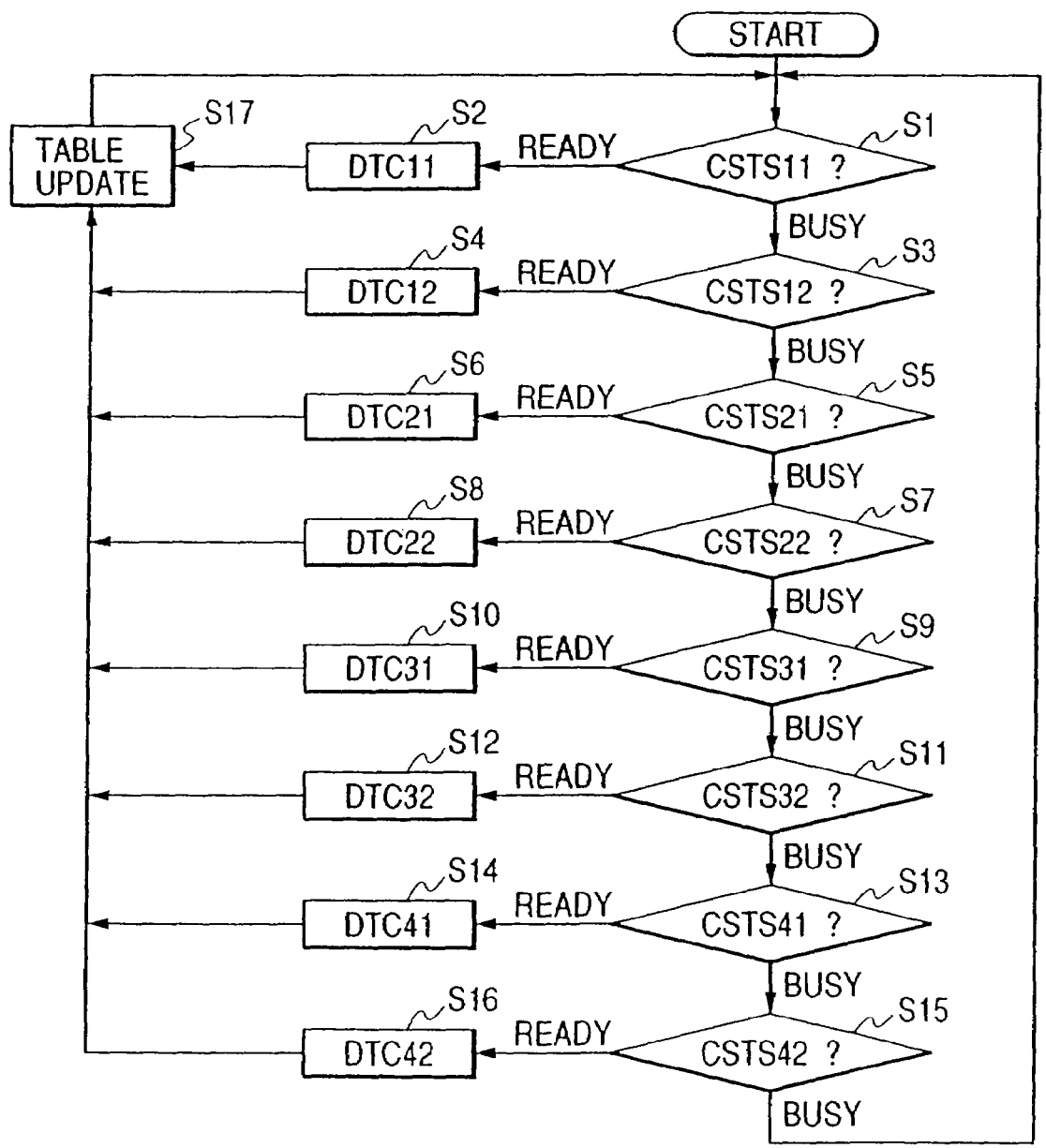
FIG. 14 is a flowchart showing another example of the write operation of the inventive semiconductor disk.

FIG. 14 shows by flowchart an example of the write operation of the inventive semiconductor disk device in the case of using the contents of the foregoing buffer control table 18. Shown in this example is the operation of successive data transfer from the host to the semiconductor disk after the initiation of data writing.

Each block CSTSnm (n=1,2,3,4;m=1,2) indicates the operation to check the information field indicated by chip number n and bank number m in the buffer control table 18, and it branches to the direction of Ready if the buffer information 1 is not "empty" and the pointed flash memory chip has Ready status, or to the direction of Busy if it has Busy status.

Each block DTCnm (n=1,2,3,4;m=1,2) indicates the operation of the controller 1 to issue a write command to the specified bank of chip n in accordance with the information field indicated by the chip number n and bank number m in the buffer control table 18, and to issue commands to initiate the transfer of data held by the data buffer indicated by the buffer information 1 and the automatic writing within the chip.

The block of Table Update indicates the operation for revising the buffer control table 18 after the transfer of write data from the controller 1 to the flash memory 3.

Based on the operational procedure shown in FIG. 14, the flash memory chips specified by the combination of the chip number and bank number indicated by the buffer control table 18 are checked for their Ready/Busy status. Specifically, if a flash memory chip is Ready, the operation takes place to transfer the data held by the data buffer and revise the buffer control table 18, and then proceeds to the checking of the information relevant to chip No. 1 and bank No. 1. Otherwise, if the flash memory chip is Busy, the operation proceeds to the checking of the information relevant to the combination of the next chip number and the bank number. These operations are repeated to write data to the semiconductor disk device.

Although the operation of status checking is shown in this example, which always takes place always for bank No. 1 of chip No. 1 after the buffer control table 18 has been revised, a variant operational procedure after the transfer of data to one bank following the revision of the buffer control table 18 is to check the status for a bank other than bank No. 1 of chip No. 1. According to the arrangement and operation of this embodiment described above, it becomes possible for a bank among all banks of all multi-bank flash memory chips that has finished the writing early and become Ready to proceed immediately to the next data writing, whereby the efficient write operation can be accomplished without wasting time.

Although in this embodiment, the four multi-bank flash memory chips each having two banks are provided with 16 data buffers 1101-1116 each having a 1-page capacity, a variant arrangement based on this invention is to have FIFO data buffers of an arbitrary number, which is greater than the number of multi-bank flash memory chips, allotted to the flash memory chips, and the present invention is not confined in terms of the number of chips, number of banks, or number of data buffers.

Although in this embodiment, there is no fixed combination between the buffer number, the chip number, and bank number in the buffer control table 18, an alternative design provides a fixed combination of the chip number and bank number for each buffer number so that each bank has a certain data buffer.

Figure 15:
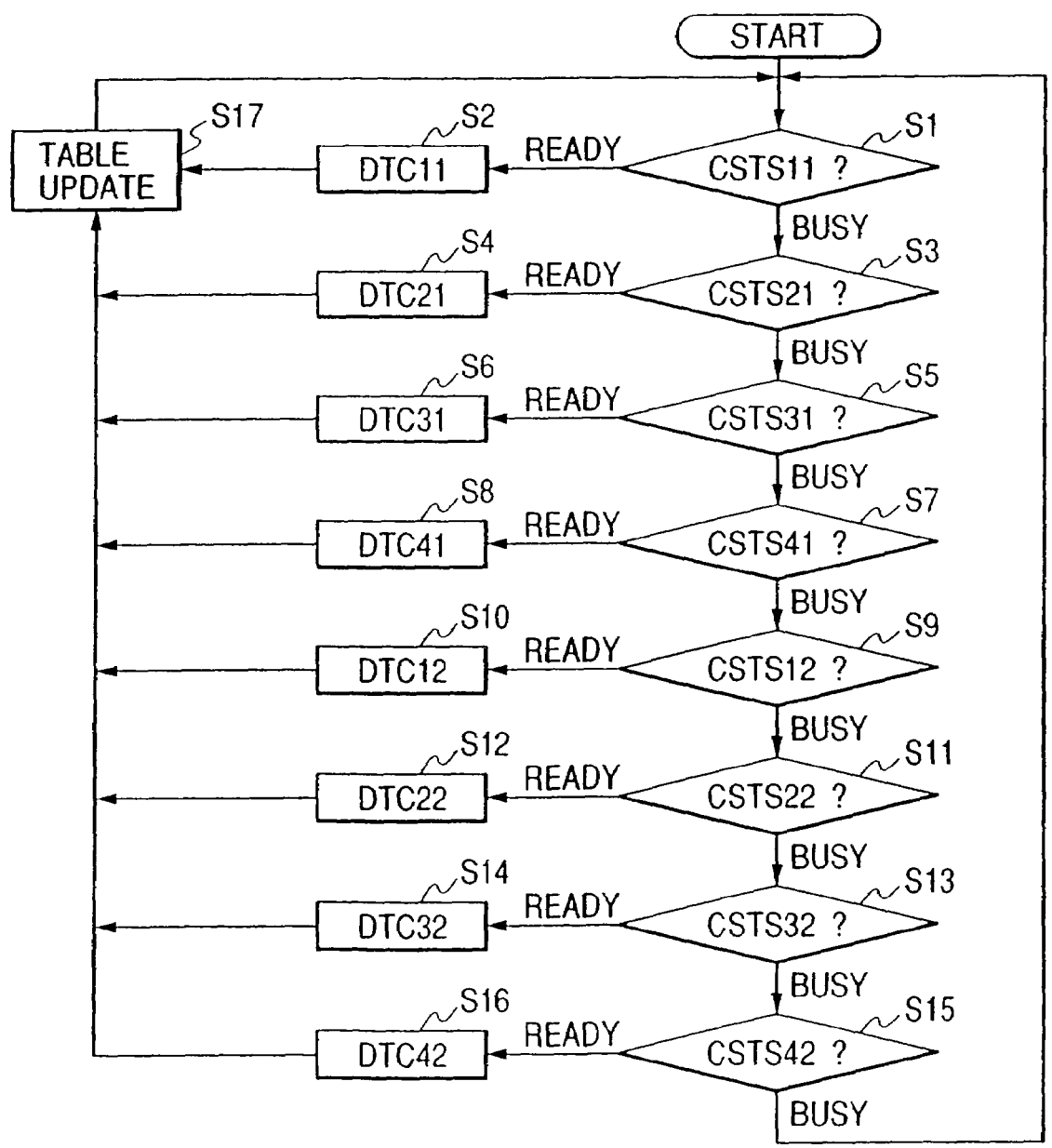
FIG. 15 is a flowchart showing another example of the write operation of the inventive semiconductor disk.

The present invention is not confined in terms of the order of checking among the banks of each multi-bank flash memory chip, but it is also possible to write data in the order shown in FIG. 15, for example.

Other Embodiments

Figure 16:
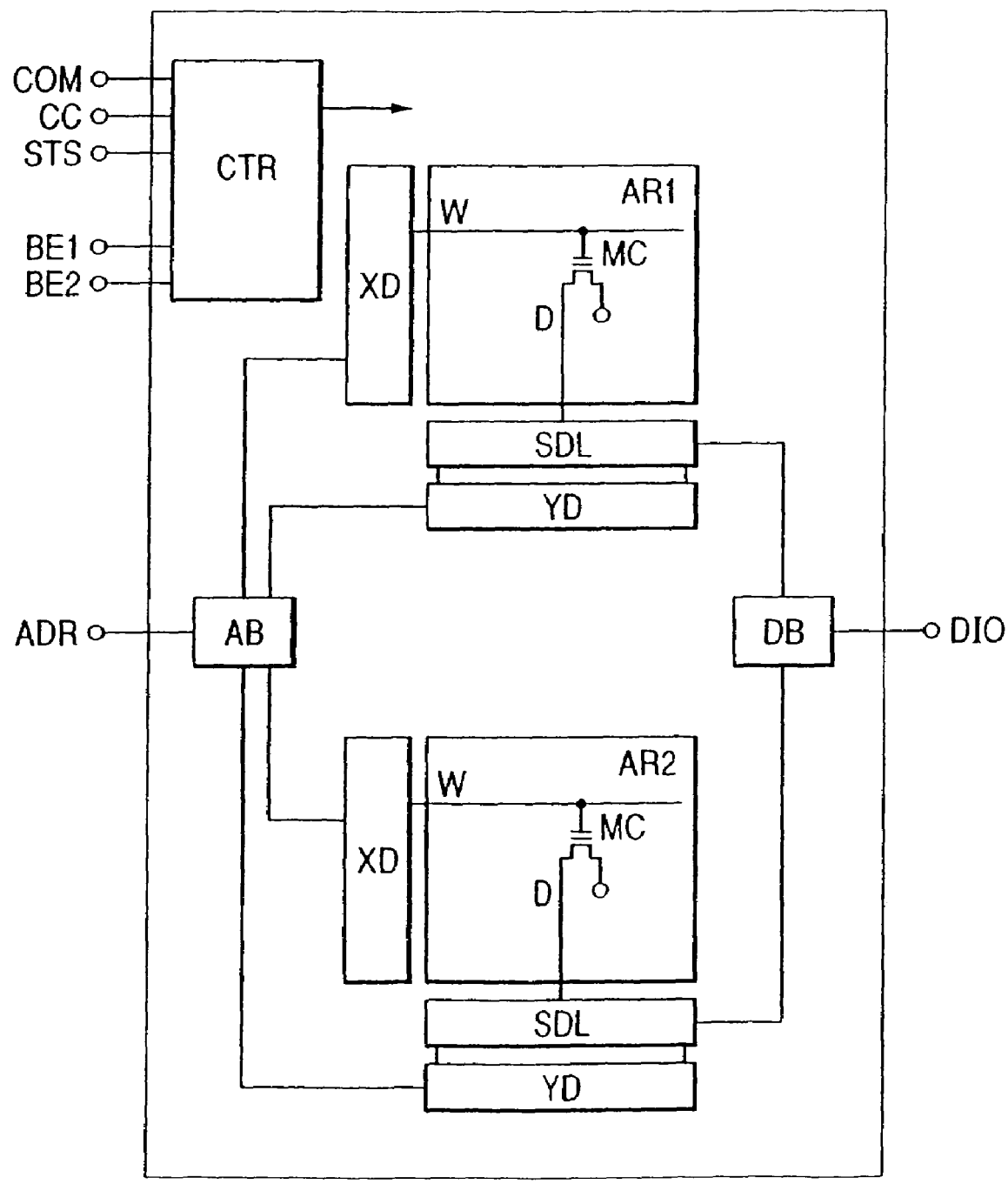
FIG. 16 is a block diagram showing another example of the arrangement of the non-volatile semiconductor memory device which has multiple banks based on this invention.

FIG. 16 shows another example of the arrangement of the multi-bank flash memory based on this invention. The flash memory has an address input terminal ADR, a control command input terminal COM, a status output terminal STS for indicating the status of the semiconductor memory device to the outside, a set of control signal terminals CC excluding BE1 and BE2, a data input/output terminal DIO, a bank No. 1 enable signal terminal BE1, a bank No. 2 enable signal terminal BE2, and power supply terminals (not shown). With the provision of a multiplexer circuit within the chip, the ADR, CON, DIO, and STS signals can share terminals.

The flash memory incorporates an internal control signal generation circuit CTR, a data input/output buffer circuit DB, an address buffer circuit AD, memory arrays AR1 and AR2 having memory cells MC at intersections of word lines W and bit lines D (only one memory cell MC, word line W, and bit line D are shown in each memory cell array for the sake of simplicity), sense circuits and data registers SDL, X-address decoder circuits XD which decode the address signal to select word lines W of the arrays AR1 and AR2, and Y-address decoder circuits YD which decode the address signal to select bit lines D of the arrays AR1 and AR2. The sense circuit and data register SDL can be simply a sense circuit having a data holding function. The memory cell arrays AR1 and AR2 are designed to operate independently from each other as independent banks.

When the bank enable signals are used, since each bank is selected and controlled by the individual selection signals BE1 and BE2, the multi-bank flash memory of the present invention has an equivalent function as the case where two of the conventional one bank flash memory chips are used.

Therefore, for example, in the device having the two of the conventional one bank flash memory chips, when the two one bank flash memory chips are replaced with the multi-bank flash memory chip of the present invention, there is the advantage that the least modification of the firmware is required.

The non-volatile semiconductor memory device of this arrangement has its operation controlled based on the distribution to the componential circuits of the internal control signals produced by the internal control signal generation circuit CTR, depending on the control signals CC, input command, bank enable signals BE1 and BE2, and the states of the circuits. The bank enable signal BE1 or BE2 in the active state points the memory array AR1 or AR2 to be the selected bank.

The internal control signal generation circuit CTR receives from the outside the read, write, erase, and status polling commands and the address designation for a bank selected by a bank enable signal, and produces and sends the internal control signals to the bank.

Specifically, when the bank AR1 is selected by the bank enable signal, it is possible to distinguish the input command to be a command for the bank AR1, so that it acts on the bank AR1 irrespective of the Ready/Busy state of the bank AR2. For example—during the write operation of data from the data register SDL to the memory cell array of the bank AR2, it is possible to transfer data from the outside to the data register of the 0 bank AR1.

Based on the above-mentioned arrangement, it becomes possible to control multiple banks of one multi-bank flash memory chip separately from the outside.

Although this embodiment describes the case of two banks provided 25 for one multi-bank flash memory chip, the present invention is not confined to this arrangement, but the invention is applicable to the cases of three or more banks in one multi-bank flash memory chip by designing the bank enable signals to take states more than the number of banks.

At this time, the number of lines for the bank enable signals may be prepared so that the status taken by the bank enable signals is greater than the number of banks by one or more. In other words, if the multi-bank flash memory chip has seven banks, at least three bank enable signals may be provided. This is because a total of eight kinds of status can be represented by setting the three bank enable signals to a high or a low status.

Specifically, for example, for a multi-bank flash memory having four banks, the number of states which the bank enable signals need to have is four, for selecting the four banks plus one state for no bank selection, and it is enough for three bank enable signals, which can have eight states, to produce these five states.

Figure 18:
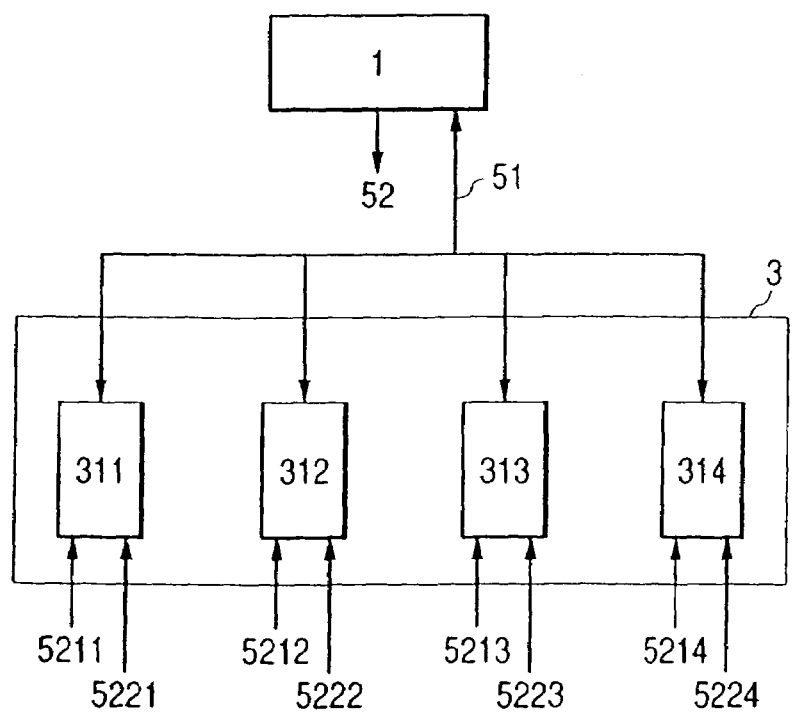
FIG. 18 is a block diagram showing another example of the arrangement of the non-volatile semiconductor memory device based on this invention.

FIG. 18 shows an example of the arrangement of the flash memory 3 in the case of using the foregoing multi-bank flash memory for the semiconductor disk of FIG. 5, which is formed" of four flash memory chips in this example.

The memory bus 5 shown in FIG. 5 connects the controller to the memory chips, as shown in FIG. 18. Lines 5211 through 5214 and lines 5221 through 5225 of chip select signals DE1 and BE2 are wired from the controller 1 to the individual multi-bank flash memory chips separately. The bank select signal lines 11-5224 are shown generically as a wiring 52 at the controller 1, and the interconnection is not shown. Another wiring 51 represents an 8-bit I/O data/address bus and various control 5 signal lines connected to the control signal terminals of the multi-bank flash memory chips, and it is common to all flash memory chips.

In this arrangement, the address, data and various control signals sent from the controller 1 to the flash memory 3 over the I/O data/address bus of the wiring 51 act only a bank selected by a bank enable signals, so that each bank of each multi-an flash memory chip is controlled separately.

As a variant arrangement of the foregoing multi-bank flash memory used for the semiconductor disk of FIG. 5, only chip select signals of multi-bank flash memory chips are wired separately, with the bank enable signals BE1 and BE2 being wired commonly to all flash memory chips, and in this case, it becomes possible to control each bank of each multi-bank flash memory chip based on the combination of a chip select signal and a bank enable signal.

Consequently, a semiconductor disk device is provided which uses the foregoing multi-bank flash memory and is capable of controlling the banks individually, and this semiconductor disk device can write data efficiently based on the operational procedures shown in FIG. 8, FIG. 14, and FIG. 15, as in the case of the semiconductor disk device using the multi-bank flash memory shown in FIG. 11.

Although the foregoing embodiments of the semiconductor disk device using the multi-bank flash memory have the same number of banks in all multi-bank flash memory chips, the present invention is also applicable to the arrangement of multi-bank flash memory chips having different numbers of banks or the arrangement including flash memory chips having only one bank.

It is possible for all of the foregoing embodiments to have a flash memory or multi-bank flash memory of the type of multi-value memory in which each memory cell can store more than one bit.

As described above, the present invention accomplishes a fast-writing semiconductor disk device and a method of writing on the disk, based on the ability of immediate initiation of the next write operation of a non-volatile semiconductor memory device which has finished the writing early.

Furthermore, the present invention enables the control of individual banks of a non-volatile semiconductor memory device from the outside.

What is claimed is:

1. A non-volatile memory device comprising:
   a first memory bank including a plurality of first memory cells and a first data register;
   a second memory bank including a plurality of second memory cells and a second data register; and
   a data buffer to temporarily hold data which is transmitted to the first or second memory bank and which is logically addressed, wherein a capacity of the data buffer is equal to or larger than a sum of capacities of the first and second data registers:
   an address buffer coupled to the first and second memory banks,
   wherein data transferred from the data buffer to the first data register is written into the plurality of first memory cells,
   wherein data transferred from the data buffer to the second data register is written into the plurality of second,
   wherein, while the plurality of first memory cells are written with data held in the first data register, the non-volatile memory device is adapted so that data inputted from external of the non-volatile memory device to the data buffer is transmitted to the second data register,
   wherein, while the plurality of second memory cells are written with data held in the second data register, the non-volatile memory device is adapted so that data inputted from external of the non-volatile memory device to the data buffer is transmitted to the first data register, and
   wherein the first memory bank is adapted to operate independently of the second memory bank.

2. A non-volatile memory device of according to claim 1, wherein the first and second memory bank and the address buffer are formed on a first memory chip.

3. A non-volatile memory device according to claim 2, further comprising:
   a third memory bank including a plurality of third memory cells and a third data register; and
   a fourth memory bank including a plurality of fourth memory cells and a fourth data register,
   wherein the third and fourth memory banks are formed in a second memory chip, and
   wherein data terminals of the first memory chip and data terminals of the second memory chip are coupled to each other.

* * * * *